US007111112B2

(12) United States Patent
Tsukude

(10) Patent No.: US 7,111,112 B2
(45) Date of Patent: Sep. 19, 2006

(54) SEMICONDUCTOR MEMORY DEVICE HAVING CONTROL CIRCUIT

(75) Inventor: Masaki Tsukude, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 464 days.

(21) Appl. No.: 10/270,137

(22) Filed: Oct. 15, 2002

(65) Prior Publication Data
US 2003/0196057 A1 Oct. 16, 2003

(30) Foreign Application Priority Data
Apr. 16, 2002 (JP) .............................. 2002-113788

(51) Int. Cl.
*G06F 12/00* (2006.01)
*G11C 7/00* (2006.01)

(52) U.S. Cl. ...................................... 711/106; 365/222
(58) Field of Classification Search ........ 711/105–106, 711/167, 156; 365/222, 195, 196
See application file for complete search history.

(56) References Cited

U.S. PATENT DOCUMENTS 6,438,055 B1 * 8/2002 Taguchi et al. ............. 365/222

6,625,077 B1 * 9/2003 Chen ........................ 365/222
6,646,943 B1 * 11/2003 Kim ......................... 365/222
6,697,910 B1 * 2/2004 Tsukude et al. ............ 711/106
2003/0112687 A1 * 6/2003 Tang ........................ 365/222

FOREIGN PATENT DOCUMENTS

KR 1998-060894 10/1998

OTHER PUBLICATIONS

Kazuhiro Sawada et al., "A 30-μA Data-Retention Pseudostatic RAM with Virtually Static RAM Mode", IEEE Journal of Solid-State Circuits, vol. 23, No. 1, Feb. 1998, pp. 12-19.
Related U.S. Appl. No. 09/987,895, filed Nov. 16, 2001, (Our Ref. No. 57454-291).

* cited by examiner

*Primary Examiner*—Denise Tran
(74) *Attorney, Agent, or Firm*—McDermott Will & Emery LLP

(57) ABSTRACT

In a freeze reset circuit in a semiconductor memory device, when a row act signal is not activated in a predetermined period determined by a trailing edge delay circuit after a chip enable signal is set to the H level during a write or read operation, a freeze reset signal is output from a logic gate after a predetermined period. As a result, the semiconductor memory device terminates the write or read operation. Therefore, the semiconductor memory device can ensure the stability of the write or read operation.

4 Claims, 14 Drawing Sheets

SEMICONDUCTOR MEMORY DEVICE HAVING CONTROL CIRCUIT

BACKGROUND OF THE INVENTION

1. Field of the Invention

The present invention relates to a semiconductor memory device, and particularly to a dynamic semiconductor memory device capable of performing a refresh operation independently of input signals from the outside (which will be referred to as a "complete-hidden-refresh-function-included DRAM" hereinafter).

2. Description of the Background Art

In a field of portable terminals such as mobile phones, there is widely adopted an asynchronous general-purpose static semiconductor memory device (which will be referred to as a "SRAM" hereinafter) for which external clocks need not be supplied. In the SRAM, the refresh operation is unnecessary. Therefore, the memory can be accessed without having to wait until the refresh cycle finishes, and a complex control thereof is not needed. Thus, the system configuration can be simplified by using the SRAM. For this reason, the SRAM was suitable for use with the portable terminal.

Recently, however, the function of the portable terminal has been improved significantly, and even the portable terminal comes to require a large-capacity memory function. The SRAM has a memory cell size which is about 10 times larger than that of a dynamic semiconductor memory device (which will be referred to as a "DRAM" hereinafter). Thus, the cost for a chip will significantly be increased to make an SRAM with large capacity. For this reason, there has been an idea to use the DRAM having a lower cost per unit bit of memory in place of the SRAM in the portable terminal.

The DRAM, however, requires a complex memory control for performing the refresh operation. For portable-terminal manufacturers that have been engaged in design of systems using SRAMs as memories, it is therefore not easy to use DRAMs as substitutive memories of SRAMs.

Under these circumstances, each semiconductor manufacturer has begun the development of a new semiconductor memory device which is the DRAM in nature but operates as the SRAM externally. This new semiconductor memory device is reported in the publication of Kazuhiro Sawada, IEEE JOURNAL OF SOLID-STATE CIRCUITS, Vol. 23, No. 1, February 1998, (pp.12–19).

For this new semiconductor memory device, the same internal memory cells as those used in the DRAM are used. On the other hand, external interfaces such as control signals and address signals input to the semiconductor memory device are the same as those of the SRAM. Different from the refresh operation or self-refresh operation of the conventional DRAM, the refresh operation of the new semiconductor memory device is not controlled by signals received from the outside. Rather, the refresh operation is performed based on a refresh command signal /REFE periodically output from a refresh circuit provided within the semiconductor memory device. The refresh circuit includes a timer circuit which is a ring oscillator, and outputs the refresh command signal /REFE in response to a cycle signal periodically output from the timer circuit. The timer circuit continuously outputs the cycle signal.

Based on that function, the new semiconductor memory device as described above will be referred to as a "complete-hidden-refresh-function-included DRAM". The development of the complete-hidden-refresh function-included DRAM enables an adaptation to a higher-performance portable terminal.

The complete-hidden-refresh-function-included DRAM selects an operation state or a standby state by an external signal. The operation state is a state in which a write or read operation can be performed. The standby state is a state in which the write or read operation is not performed. It is to be noted that, the refresh operation is performed regardless of the standby state or the operation state.

In normal operation, the write or read operation is performed in the operation state. There may be a situation, however, wherein the write or read operation is still performed when the operation state is terminated by a signal from the outside. In such situation, if the write or read operation is terminated because of the termination of the operation state, the accurate write or read operation will not be possible.

SUMMARY OF THE INVENTION

An object of the present invention is to provide a semiconductor memory device that can ensure the stability of a write or read operation in a semiconductor memory device having an operation state capable of performing data reading and writing, and a standby state to hold data.

A semiconductor memory device according to the present invention has an operation state capable of performing a read operation and a write operation of data and a standby state to hold data, and includes a memory cell array and a complete hidden refresh circuit. The memory cell array includes a plurality of memory cells arranged in columns and rows. The complete hidden refresh circuit refreshes the data held by the plurality of memory cells in a predetermined timing. The complete hidden refresh circuit includes a refresh circuit and a control circuit. The refresh circuit outputs a refresh command signal that commands to perform a refresh operation. The control circuit performs the refresh operation in response to the refresh command signal, and performs the read or write operation of data in the operation state. The control circuit stops the operation when a predetermined time has passed after the operation state is set.

With this, even under an effect of a noise or the like, the semiconductor memory device according to the present invention can terminate the write or read operation after the predetermined time, rather than continuing the read or write operation. Therefore, the stability of the write or read operation can be ensured.

With the present invention, the stability of the write or read operation can be ensured in the semiconductor memory device having the complete hidden refresh function. In addition, continuation of the write or read operation by the effect of a noise can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
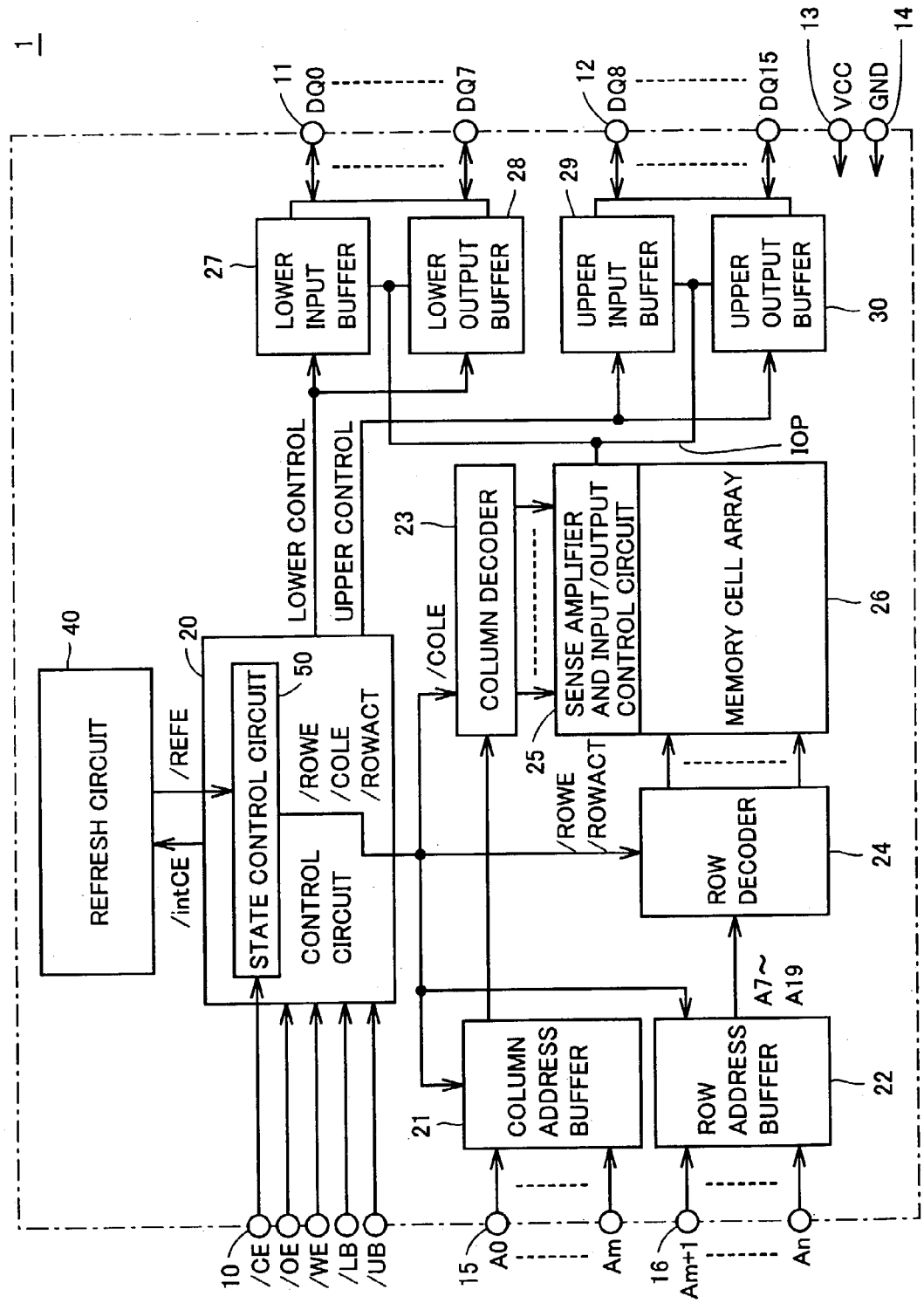
FIG. 1 shows a whole structure of a complete-hidden-refresh-function-included DRAM in a first embodiment of the present invention.

Embodiments of the present invention will be described in detail with reference to the drawings. The same characters in the drawings indicate the same or corresponding portions, and the descriptions thereof will not be repeated.

[First Embodiment]

FIG. 1 shows a whole structure of a complete-hidden-refresh-function-included DRAM in a first embodiment of the present invention.

Referring to FIG. 1, a complete-hidden-refresh-function-included DRAM 1 includes an input terminal group 10 receiving control signals, namely, a chip enable signal /CE, an output enable signal /OE, a write enable signal /WE, a control signal /LB and a control signal /UB, a terminal group 11 for inputting/outputting data signals DQ0–DQ7, a terminal group 12 for inputting/outputting data signals DQ8–DQ15, a terminal group 15 for inputting address signals A0–Am (m is a natural number equal to or larger than 1), a terminal group 16 for inputting address signals Am+1––An(n is a natural number equal to or larger than 1), a source terminal 13 supplied with a source voltage VCC, and a ground terminal 14 supplied with a ground voltage GND.

The chip enable signal /CE is a signal to set the complete-hidden-refresh-function-included DRAM to the operation state. The output enable signal /OE is a signal to set the complete-hidden-refresh-function-included DRAM to the read operation mode and to activate an output buffer. The write enable signal /WE is a signal to set the complete-hidden-refresh-function-included DRAM to the write operation mode. The control signal /LB is a signal to select input/output of data from data terminal group 11 of a lower (Lower bit) side. The control signal /UB is a signal to select input/output of data from data terminal group 12 of an upper (Upper bit) side.

The complete-hidden-refresh-function-included DRAM further includes a control circuit 20 outputting to each block a control clock corresponding to a prescribed operation mode of the complete-hidden-refresh-function-included DRAM, such as the write operation mode or the read operation mode, in response to the control signal input from data terminal group 11, a column address buffer 21 receiving address signals A0–Am corresponding to the output of control circuit 20 and transferring to inside, and a row address buffer 22 receiving address signals Am+1–An corresponding to the output of control circuit 20 and transferring to inside.

The complete-hidden-refresh-function-included DRAM further includes a column decoder 23, a row decoder 24, a memory cell array 26 including a plurality of memory cells arranged on a matrix, and a sense amplifier and input/output control circuit 25.

Column decoder 23 receives an internal address signal output from column address buffer 21 corresponding to the output of control circuit 20, and specifies the column address. Row decoder 24 receives an internal address signal output from row address buffer 22 corresponding to the output of control circuit 20, and specifies the row address. Sense amplifier and input/output control circuit 25 amplifies the output from memory cell array 26 and performs the read operation.

The complete-hidden-refresh-function-included DRAM further includes a lower input buffer 27, a lower output buffer 28, an upper input buffer 29, and an upper output buffer 30.

Lower input buffer 27 receives data signals DQ0–DQ7 from terminal group 11 corresponding to the output of control circuit 20 and transfers that to sense amplifier and input/output control circuit 25. Lower output buffer 28 receives the signal from sense amplifier and input/output control circuit 25 corresponding to the output of control circuit 20 and outputs a data signal to terminal group 11. Upper input buffer 29 receives data signals DQ8–DQ15 from terminal group 12 corresponding to the output of control circuit 20 and transfers that to sense amplifier and input/output control circuit 25. Upper output buffer 30 receives the signal from sense amplifier and input/output control circuit 25 corresponding to the output of control circuit 20 and outputs a data signal to terminal group 12.

The complete-hidden-refresh-function-included DRAM further includes a refresh circuit 40. Refresh circuit 40 outputs a refresh command signal /REFE, which is a periodically activated signal, to control circuit 20. Control circuit 20 receives the refresh command signal /REFE and outputs an operation indication signal to each block to perform the refresh operation.

Control circuit 20 makes semiconductor memory device 1 to perform the refresh operation and the write or read operation, based on the chip enable signal /CE input from the outside and the refresh command signal /REFE. Control circuit 20 receives the chip enable signal /CE from the outside and outputs an internal chip enable signal /intCE to refresh circuit 40. When the internal chip enable signal /intCE output from control circuit 20 is at the H level, semiconductor memory device 1 is set to the standby state. On the other hand, when the internal chip enable signal /intCE is at the L level, semiconductor memory device 1 is set to the operation state. It is to be noted that, the operation state is a state in which the read or write operation can be performed.

Control circuit 20 includes a state control circuit 50. The state control circuit 50 receives the chip enable signal /CE from the outside and the refresh command signal /REFE output from refresh circuit 40, and outputs a row enable signal /ROWE, a column enable signal /COLE and a row act signal /ROWACT. The row enable signal /ROWE and the row act signal /ROWACT are input to row decoder 24. A row system operation is performed in an active period of the row enable signal /ROWE. The row system operation means an operation whereby the row address signal is input to row decoder 24 and an information charges of the corresponding memory cell are amplified by the sense amplifier. The column enable signal /COLE is input to column decoder 23. A column system operation is performed in an active period of the column enable signal /COLE. The column system operation means an operation whereby the column address signal is input to column decoder 23 and, after a corresponding bit line pair and a data input/output line being connected, the data is read from the memory cell or written into the memory cell.

It is to be noted that, the write or read operation is performed while the row act signal /ROWACT is activated.

Figure 2:
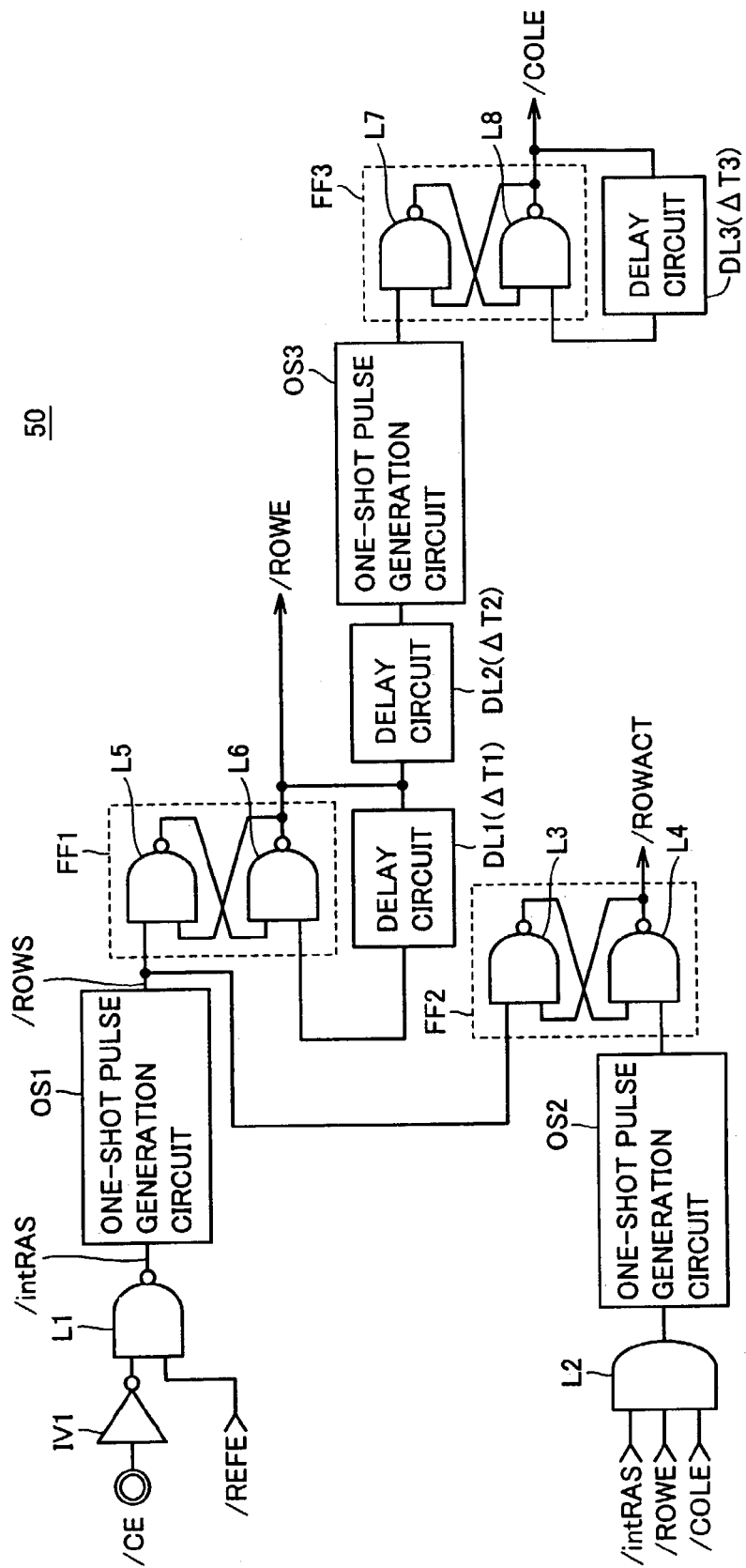
FIG. 2 is a circuit diagram showing a structure of a state control circuit shown in FIG. 1.

FIG. 2 is a circuit diagram showing a structure of state control circuit 50 shown in FIG. 1.

Referring to FIG. 2, state control circuit 50 includes an inverter IV1, delay circuits DL1–DL3, one-shot pulse generation circuits OS1–OS3, and flip-flops FF1–FF3.

Inverter IV1 receives the chip enable signal /CE, inverts the same and outputs the result. A logic gate L1 receives the output signal of inverter IV1 and the refresh command signal /REFE, and outputs the NAND logical operation result as an internal row address strobe signal /intRAS.

When one-shot pulse generation circuit OS1 receives the activated internal row address strobe signal /intRAS, it outputs a one-shot pulse signal /ROWS of the L (logical low) level to flip-flops FF1 and FF2.

Flip-flop FF1 includes logic gates L5 and L6. Logic gate L5 receives the one-shot pulse signal /ROWS and the output signal of logic gate L6, and outputs the NAND logical operation result. Logic gate L6 receives the output signal of logic gate L5 and the output signal of delay circuit DL1, and outputs the NAND logical operation result as the row enable signal /ROWE. Delay circuit DL1 receives the row enable signal /ROWE, delays it for a predetermined time ΔT1 and outputs the delayed signal to logic gate L6.

Delay circuit DL2 receives the row enable signal /ROWE and delays it for a predetermined time ΔT2. One-shot pulse generation circuit OS3 receives the output signal of delay circuit DL2, and outputs the one-shot pulse signal to flip-flop FF3.

Flip-flop FF3 includes logic gates L7 and L8. Logic gate L7 receives the one-shot pulse signal of the L level output from one-shot pulse generation circuit OS3 and the output signal of logic gate L8, and outputs the NAND logical operation result. Logic gate L8 receives the output signal of logic gate L7 and the output signal of delay circuit DL3, and outputs the NAND logical operation result as the column enable signal /COLE. Delay circuit DL3 receives the column enable signal /COLE, delays it for a predetermined time ΔT3 and outputs the result to logic gate L8.

Flip-flop FF2 includes logic gates L3 and L4. Logic gate L3 receives the one-shot pulse signal /ROWS output from one-shot pulse generation circuit OS1 and the output signal of logic gate L4, and outputs the NAND logical operation result. Logic gate L4 receives the output signal of logic gate L3 and the output signal of one-shot pulse generation circuit OS2, and outputs the NAND logical operation result as the row act signal /ROWACT. One-shot pulse generation circuit OS2 receives the output signal of logic gate L2 and outputs the one-shot pulse signal of the L level to flip-flop FF2.

Logic gate L2 receives the internal row address strobe signal int/RAS, the row enable signal /ROWE and the column enable signal /COLE, and outputs the AND logical operation result.

The operation of state control circuit 50 having the above-mentioned circuit structure will now be described.

Figure 3:
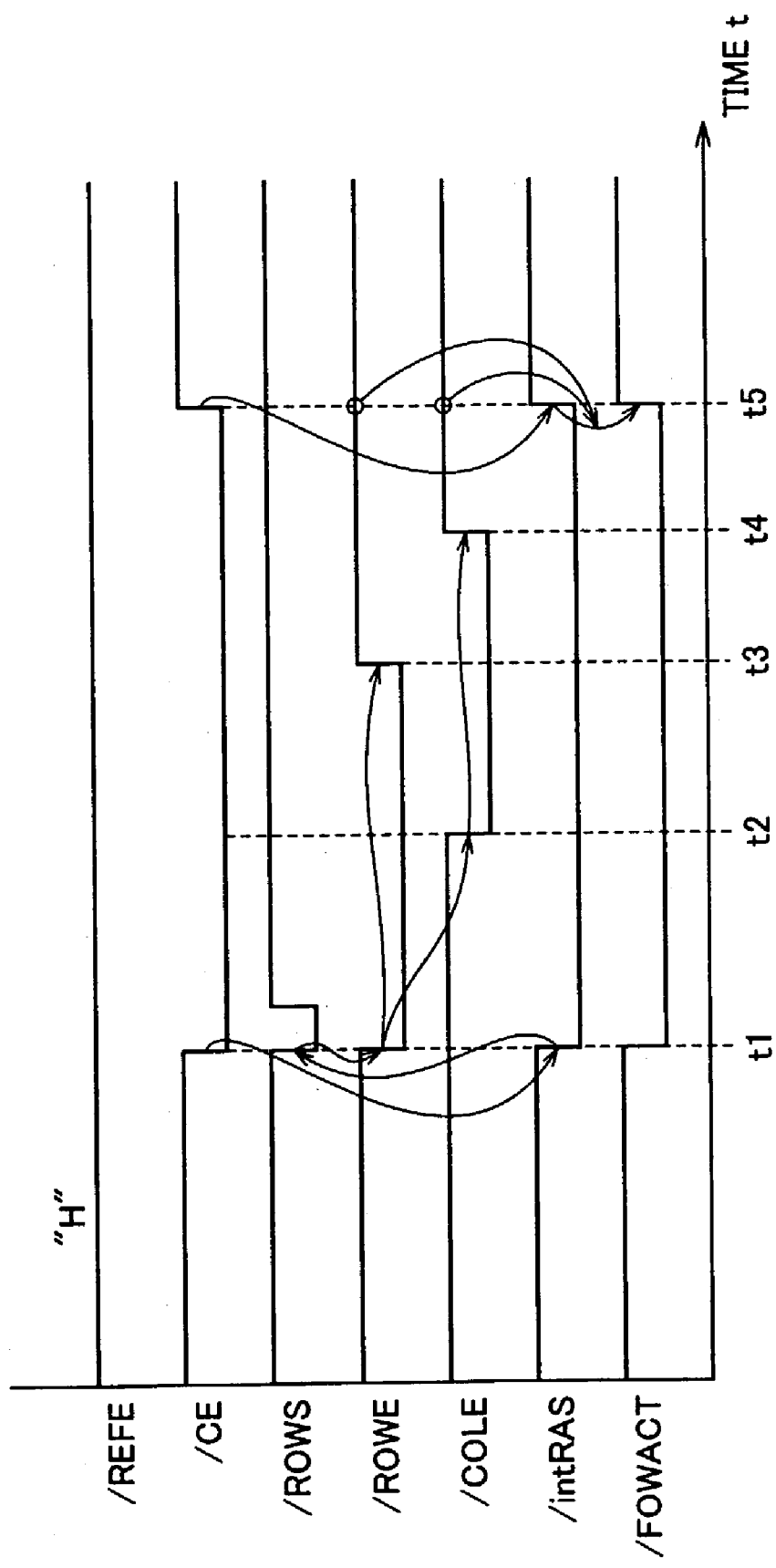
FIG. 3 is a timing chart showing a read or write operation of the state control circuit shown in FIG. 2.

FIG. 3 is a timing chart showing the read or write operation of state control circuit 50 shown in FIG. 2.

Referring to FIG. 3, the chip enable signal /CE is activated from the H (logical high) level to the L level at a time t1. At this point, semiconductor memory device 1 changes from the standby state to the operation state.

Assuming that the refresh command signal /REFE is at the H level, the refresh operation is not performed in semiconductor memory device 1. Thus, the internal row address strobe signal int/RAS output from logic gate L1 in state control circuit 50 is activated to the L level at the time t1. One-shot pulse generation circuit OS1 receives the activated internal row address strobe signal int/RAS, and outputs the one-shot pulse signal /ROWS of the L level. As a result, flip-flop FF1 outputs the row enable signal /ROWE of the L level at the time t1. Therefore, the row system operation is started at the time t1 in semiconductor memory device 1. In addition, the row enable signal /ROWE is input to delay circuits DL1 and DL2 at the time t1.

The one-shot pulse signal /ROWS is input to flip-flop FF2 at the same time t1. As a result, flip-flop FF2 outputs the signal /ROWACT of the L level at the time t1. At this point, the write or read operation starts.

Delay circuit DL2 outputs the activated row enable signal /ROWE at a time t2, the predetermined period ΔT2 after the start of the row system operation. As a result, one-shot pulse generation circuit OS3 outputs the one-shot pulse signal of the L level. Thus, flip-flop FF3 outputs the activated column enable signal /COLE at the time t2. At this point, the column system operation also starts.

Delay circuit DL1 outputs the row enable signal /ROWE at a time t3, the predetermined period ΔT1 after the time t1. As a result, flip-flop FF1 is reset. Thus, the row enable signal /ROWE output from flip-flop FF1 is set to the H level at the time t3.

Similarly, delay circuit DL3 outputs the column enable signal /COLE of the L level at a time t4, the predetermined period ΔT3 after the time t2. Thus, flip-flop FF3 is reset. As a result, the column enable signal /COLE output from flip-flop FF3 is set to the H level at the time t4.

Thereafter, the chip enable signal /CE is set to the H level at a time t5. Thus, semiconductor memory device 1 changes from the operation state to the standby state. At this time, logic gate L2 in state control circuit 50 outputs the signal of the H level. Thus, one-shot pulse generation circuit OS2 outputs the one-shot pulse signal of the L level. As a result, flip-flop FF2 is reset. Thus, the signal /ROWACT output from flip-flop FF2 is set to the H level.

Therefore, semiconductor memory device 1 terminates the write or read operation at the time t5.

With this operation, semiconductor memory device 1 performs the write or read operation in the active period of the chip enable signal /CE.

The situation may happen, however, wherein the chip enable signal /CE is set to the L level during the write or read operation. Semiconductor memory device 1 thus has to perform the write or read operation normally even in such situation.

Figure 4:
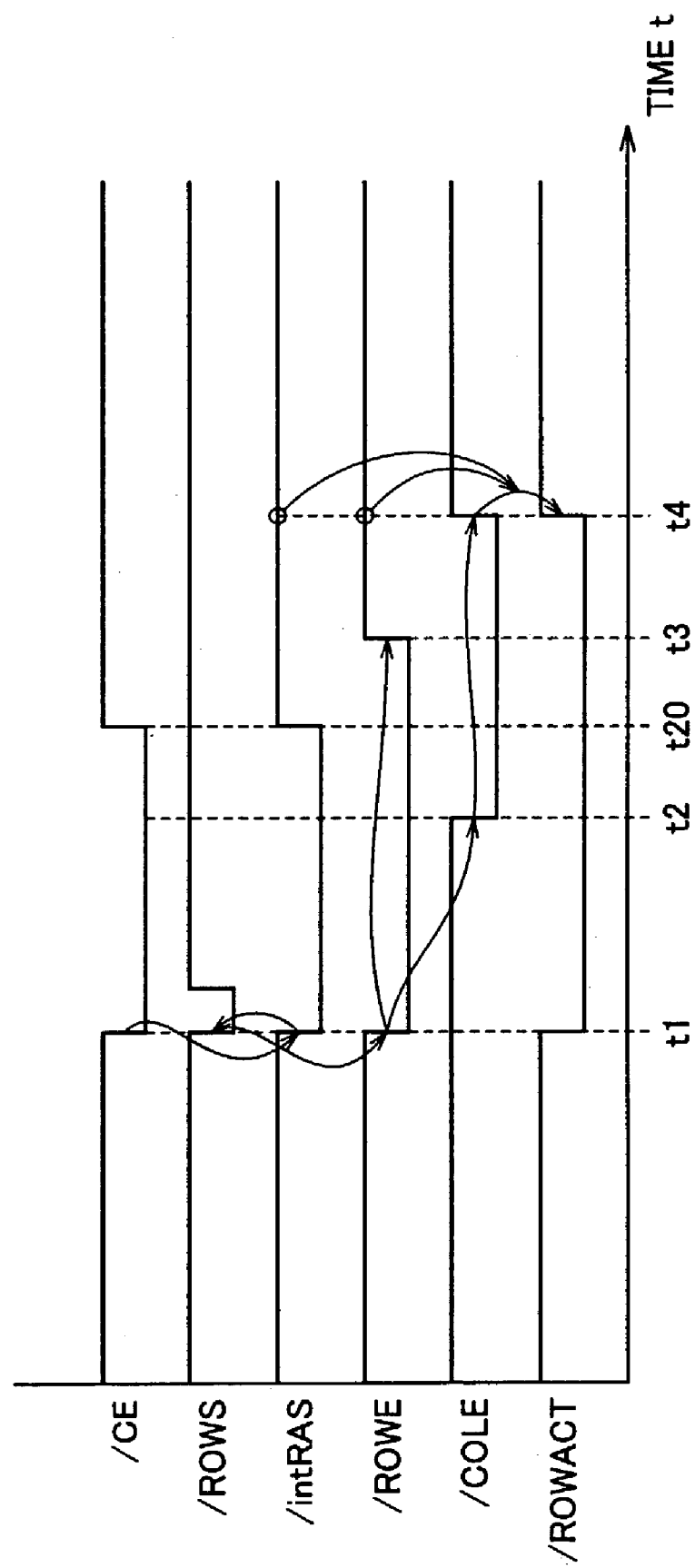
FIG. 4 is a timing chart showing an operation of the state control circuit when a chip enable signal is deactivated during the write or read operation.

FIG. 4 is a timing chart showing the operation of the state control circuit 50 when the chip enable signal is deactivated during the write or read operation.

Referring to FIG. 4, as the operation till the time t2 is the same as that shown in FIG. 3, descriptions thereof will not be repeated.

Herein, at a time t20 after the time t2, the chip enable signal /CE is set to the H level. Thus, semiconductor memory device 1 is set to the standby state. At the time t20, however, both the row enable signal /ROWE and the column enable signal /COLE have been activated, and the write or read operation is performed. Therefore, the write or read operation must continue after the time t20.

When the chip enable signal /CE is set to the H level at the time t20, the internal row address strobe signal int/RAS output from logic gate L1 is also set to the H level. Since one-shot pulse generation circuit OS1 generates the one-shot pulse signal of the L level when it receives the signal changed from the H level to the L level, one-shot pulse generation circuit OS1 does not output the one-shot pulse signal /ROWS at the time t20.

Therefore, similar to FIG. 3, flip-flop FF1 is reset and the row enable signal /ROWE is set to the H level at the time t3. In addition, flip-flop FF3 is reset and the column enable signal /COLE is set to the H level at the time t4. Since the internal row address strobe signal int/RAS is already set to the H level at this point, the output signal of logic gate L2 is set to the H level at the time t4. Thus, one-shot pulse generation circuit OS2 outputs the one-shot pulse signal of the L level. As a result, the row act signal /ROWACT is set to the H level, and the write or read operation is terminated.

With this operation, semiconductor memory device 1 can continue the write or read operation even when the chip enable signal /CE is deactivated during the write or read operation. As a result, semiconductor memory device 1 will be free of a malfunction such as the refresh operation during the write or read operation.

Indication for the write or read operation from the outside is done by the chip enable signal /CE. In addition, if the refresh is requested from the inside when the chip enable signal /CE is inactive, semiconductor memory device 1 performs the refresh operation.

As described above, the complete-hidden-refresh-function-included DRAM adopts a sequential circuit such as a flip-flop to mediate between the write or read indication from the outside and the refresh request from the inside, as shown in state control circuit 50 in FIG. 2.

The flip-flop is reset only when it receives a reset signal. Thus, there may be a state wherein flip-flop is not reset (hereinafter, this state is referred to as a freeze state) because of an effect of a noise or the like.

Figure 5:
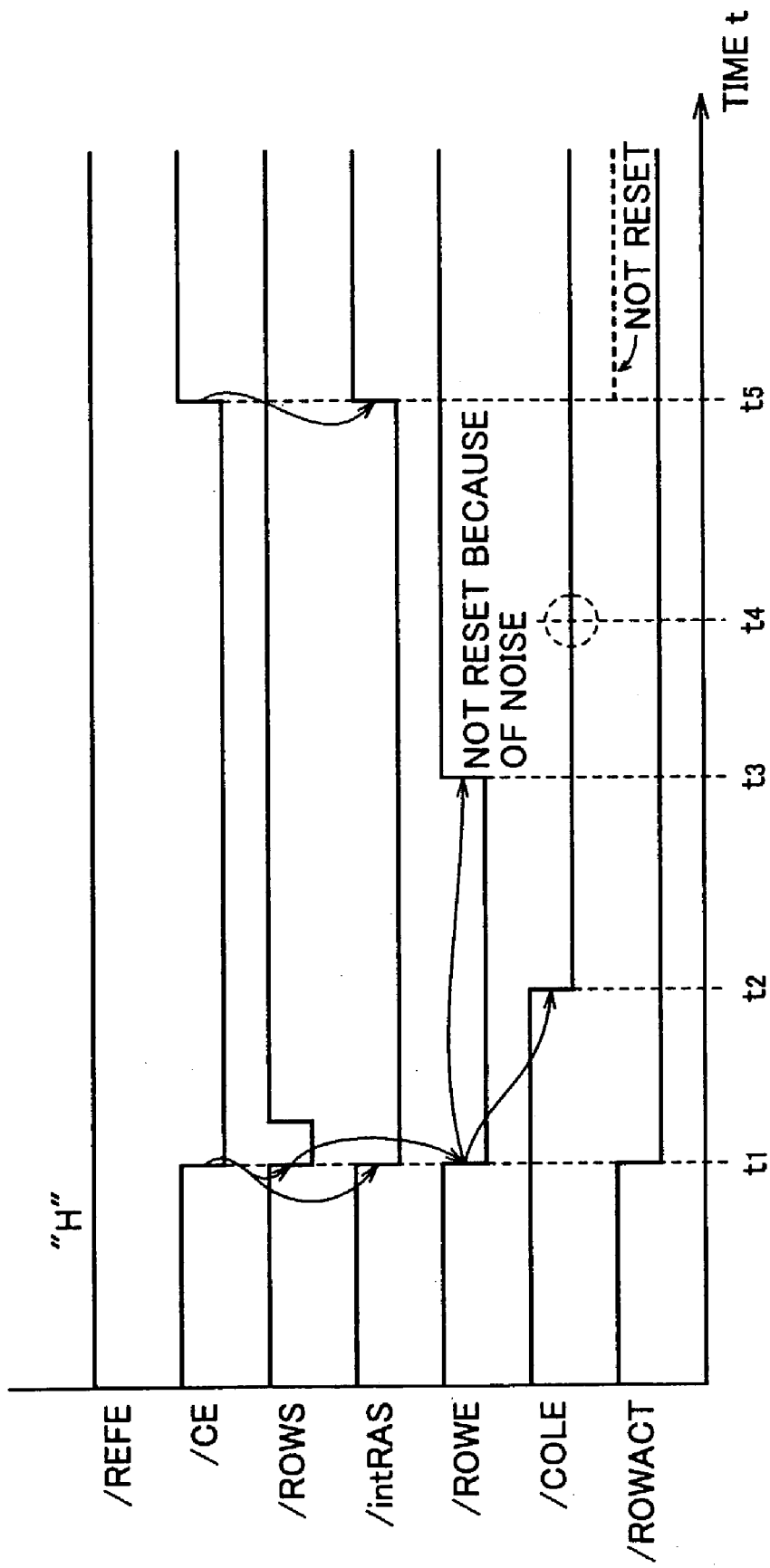
FIG. 5 is a timing chart showing an operation when a column enable signal is effected by a noise during the write or read operation in a semiconductor memory device.

FIG. 5 is a timing chart showing the operation when the column enable signal /COLE is effected by a noise during the write or read operation in semiconductor memory device 1.

Referring to FIG. 5, as the operation between the time t1 and the time t4 is the same as that shown in FIG. 3, descriptions thereof will not be repeated.

Though the column enable signal /COLE is set to the H level at the time t4 after flip-flop FF3 outputs the column enable signal /COLE of the L level at the time t2 in FIG. 3, the column enable signal /COLE remains at the L level after the time t4 because of the noise in FIG. 5. As a result, when the internal row address strobe signal int/RAS is set to the H level at the time t5 when the chip enable signal /CE is set to the H level, as the column enable signal /COLE remains at the L level, the output signal of logic gate L2 remains at the L level. Consequently, one-shot pulse generation circuit OS2 does not output the one-shot pulse signal. Thus, flip-flop FF2 is not reset, and the row act signal /ROWACT remains at the L level.

As a result of the above-mentioned operation, when the row enable signal /ROWE, the column enable signal /COLE, the internal row address strobe signal int/RAS and the like remain in the active states because of the noise, the row act signal /ROWACT remains in the active state since flip-flop FF3 is not reset. Therefore, the write or read operation state is not terminated but is maintained. Such state is referred to as a freeze state.

It is necessary to reset the freeze state and ensure the operation stability in the complete-hidden-refresh-function-included DRAM.

Figure 6:
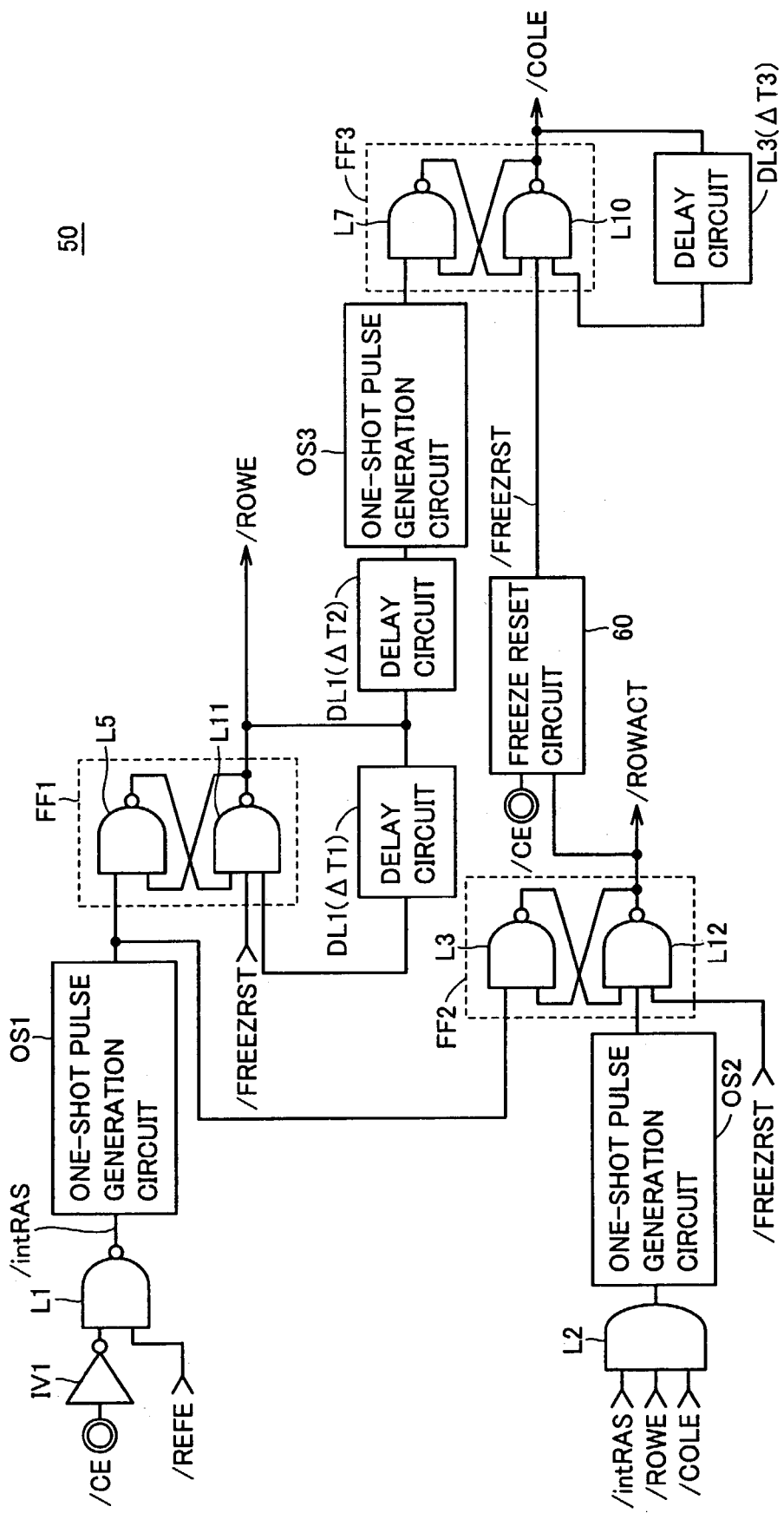
FIG. 6 shows a structure of the state control circuit in the embodiment of the present invention.

FIG. 6 shows a structure of the state control circuit 50 in the embodiment of the present invention.

Referring to FIG. 6, a freeze reset circuit 60 is added in comparison with FIG. 2. Furthermore, a logic gate L11 is arranged in place of logic gate L6 in flip-flop FF1. Similarly, a logic gate L12 is arranged in place of logic gate L4 in flip-flop FF2. In addition, a logic gate L10 is arranged in place of logic gate L8 in flip-flop FF3.

Freeze reset circuit 60 receives the chip enable signal /CE and the row act signal /ROWACT, and outputs a freeze reset signal /FREEZRST. Logic gate L11 in flip-flop FF1 receives the output signal of logic gate L5, the output signal of delay circuit DL1 and the freeze reset signal /FREEZRST, and outputs the NAND logical operation result as the row enable signal /ROWE. Logic gate L12 in flip-flop FF2 receives the output signal of logic gate L3, the output signal of one-shot pulse generation circuit OS2 and the freeze reset signal /FREEZRST, and outputs the NAND logical operation result as the row act signal /ROWACT. Logic gate L10 in flip-flop FF3 receives the output signal of logic gate L7, the output signal of delay circuit DL3 and the freeze reset signal /FREEZRST, and outputs the NAND logical operation result as the column enable signal /COLE.

As the other circuit structure is the same as that shown in FIG. 2, the description thereof will not be repeated.

Figure 7:
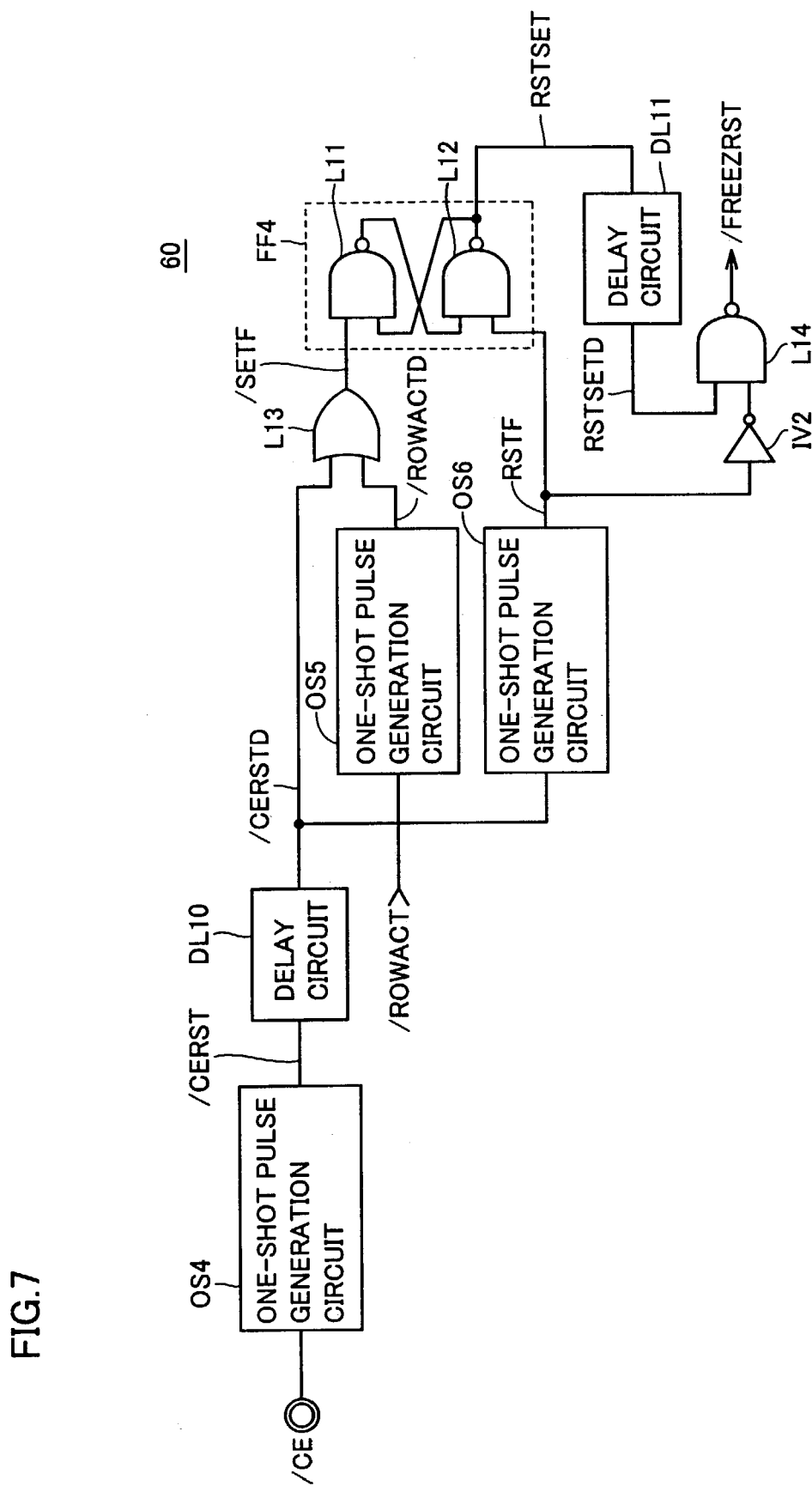
FIG. 7 is a circuit diagram showing a structure of a freeze reset circuit shown in FIG. 6.

FIG. 7 is a circuit diagram showing a structure of freeze reset circuit 60 shown in FIG. 6.

Referring to FIG. 7, freeze reset circuit 60 includes one-shot pulse generation circuits OS4–OS6, trailing edge delay circuits DL10 and DL11, logic gates L13 and L14, a flip-flop FF4, and an inverter IV2.

One-shot pulse generation circuit OS4 receives the chip enable signal /CE. When the chip enable signal /CE is set from the L level to the H level, one-shot pulse generation circuit OS4 outputs a one-shot pulse signal /CERST of the H level. Trailing edge delay circuit DL10 outputs a signal /CERSTD of the L level when it receives the one-shot pulse signal /CERST, and sets the signal /CERSTD to the H level when a predetermined time $\Delta T10$ has passed after the one-shot pulse signal /CERST is set to the H level.

One-shot pulse generation circuit OS5 outputs a one-shot pulse signal /ROWACTD of the H level when it receives the activated row act signal /ROWACT. Logic gate L13 receives the signal /CERSTD and the one-shot pulse signal /ROWACTD, and outputs the OR logical operation result as a signal /SETF. One-shot pulse generation circuit OS6 receives the activated signal /CERSTD and outputs a one-shot pulse signal RSTF of the H level.

Flip-flop FF4 includes logic gate L11 and logic gate L12. Logic gate L11 receives the output signal /SETF of logic gate L13 and the output signal of logic gate L12, and outputs the NAND logical operation result. Logic gate L12 receives the output signal of logic gate L11 and the one-shot pulse signal RSTF, and outputs the NAND logical operation result as a signal RSTSET.

Trailing edge delay circuit DL11 outputs a signal RSTSETD of the L level when it receives the signal RSTSET of the L level. In addition, it sets the signal RSTSETD to the H level when a predetermined time $\Delta T11$ has passed after the signal RSTSET is set from the L level to the H level. Inverter IV2 receives the one-shot pulse signal RSTF, inverts the same and outputs the result. Logic gate L14 receives the signal RSTSETD and the output signal of inverter IV2, and outputs the NAND logical operation result as the signal /FREEZRST.

The operation of semiconductor memory device 1 including state control circuit 50 having the above-mentioned circuit structure will now be described.

Figure 8:
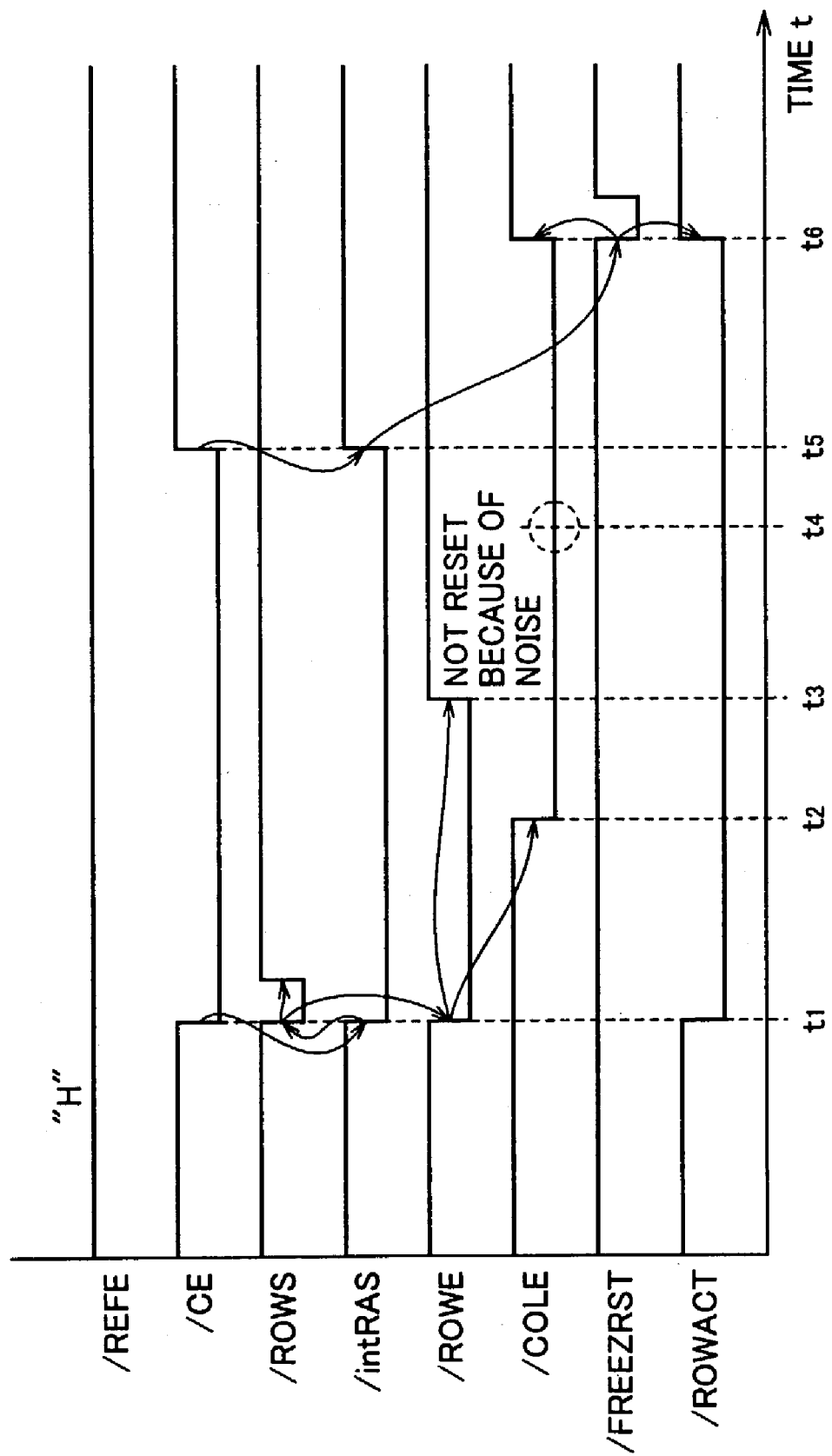
FIG. 8 is a timing chart showing an operation of the semiconductor memory device during the write or read operation in the embodiment of the present invention.

FIG. 8 is a timing chart showing the operation of the semiconductor memory device 1 during the write or read operation in the embodiment of the present invention.

Referring to FIG. 8, as the operation between the time t1 and the time t3 is the same as that shown in FIG. 2, description thereof will not be repeated.

Though the column enable signal /COLE is normally set from the L level to the H level at the time t4, in FIG. 8, the column enable signal /COLE remains at the L level after the time t4 because of the noise. Therefore, semiconductor memory device 1 continues the write or read operation.

At a time t6, the predetermined time after the time t5 when the chip enable signal /CE is set from the L level to the H level, the freeze reset signal /FREEZRST is output as the one-shot pulse signal of the L level.

As a result, flip-flop FF3 is reset and the column enable signal /COLE is set from the L level to the H level at the time t6. Thus, as logic gate L2 outputs the signal of the H level, flip-flop FF2 is reset.

With the operation described above, the row act signal /ROWACT is set to the H level at the time t6, and semiconductor memory device 1 terminates the write or read operation.

Figure 9:
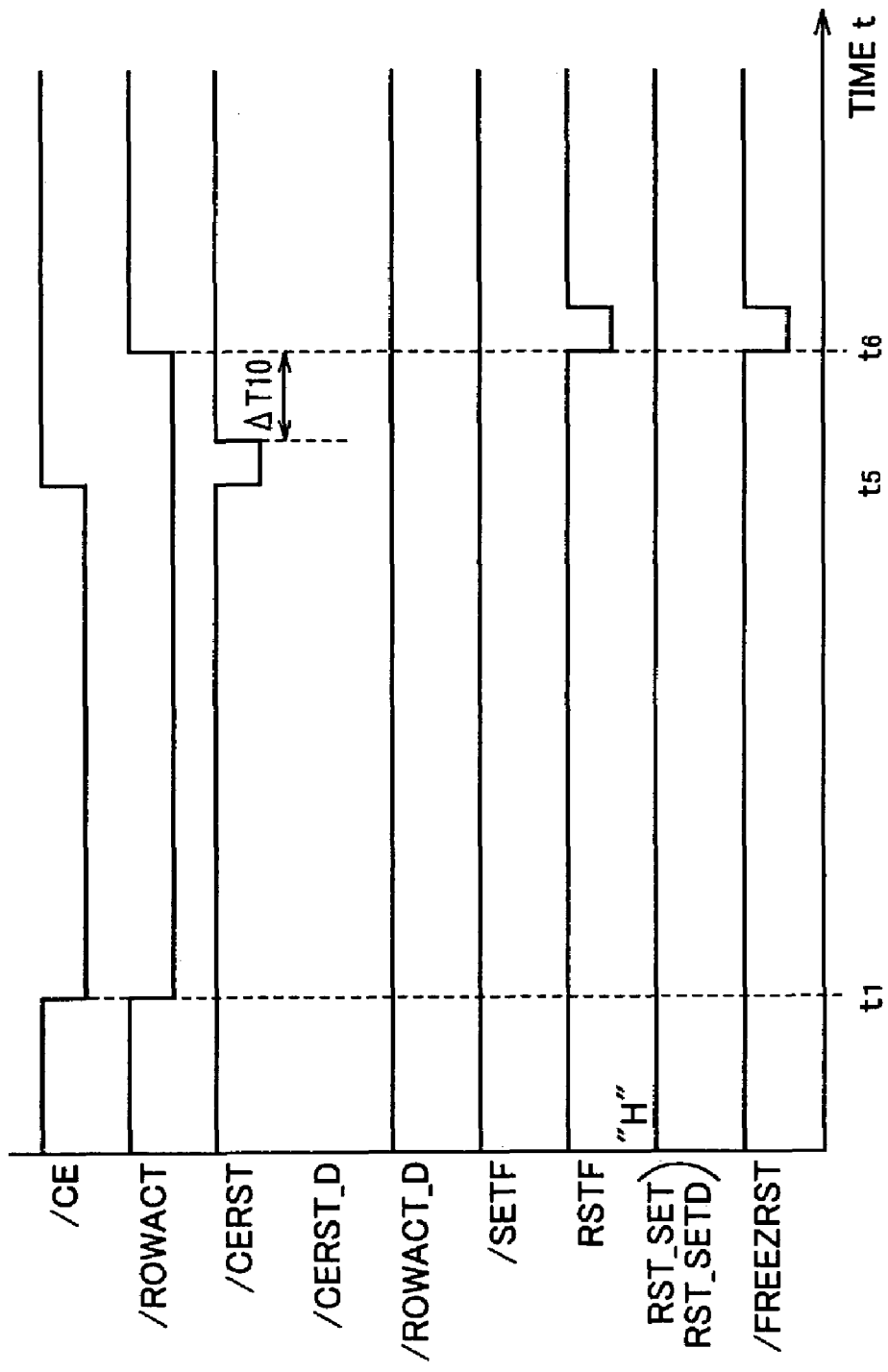
FIG. 9 is a timing chart showing an operation of the freeze reset circuit.

FIG. 9 is a timing chart showing the operation of freeze reset circuit 60.

Referring to FIG. 9, the chip enable signal /CE is set to the L level at the time t1, and semiconductor memory device 1 is set to the operation state. The chip enable signal /CE is set to the H level at the time t5, and semiconductor memory device 1 is set to the standby state.

At this point, one-shot pulse generation circuit OS4 outputs the one-shot pulse signal /CERST of the L level. Trailing edge delay circuit DL10 outputs the signal /CERSTD of the L level when it receives the one-shot pulse signal /CERST of the L level. In addition, trailing edge delay circuit DL10 sets the signal /CERSTD to the H level at the time t6, the predetermined time $\Delta T10$ after the one-shot pulse signal /CERST is set to the H level. At this point, responsive to the one-shot pulse signal /CERSTD set from the L level to the H level, one-shot pulse generation circuit OS6 outputs the one-shot pulse signal RSTF of the L level.

It is to be noted that, since the row act signal /ROWACT is at the L level after the time t1, the signal /SETF output from logic gate L13 remains at the H level after the time t1. As a result, the signal RSTSET output from flip-flop FF4 remains at the H level after the time t1. Consequently, though flip-flop FF4 receives the one-shot pulse signal RSTF of the L level at the time t6, the signal RSTSET output from flip-flop FF4 remains at the H level. Thus, the signal RSTSETD output from the trailing edge delay circuit DL11 remains at the H level after the time t1.

As a result, logic gate L14 receives the one shot pulse signal RSTF of the L level at the time t6, and outputs the freeze reset signal /FREEZRST as the one-shot pulse signal having the same pulse width at the L level as the one-shot pulse signal RSTF.

Consequently, flip-flop FF2 in state control circuit 50 is reset at the time t6, and the row act signal /ROWACT is set to the inactive state (the H level) at the time t6.

With the above-mentioned operation, freeze reset circuit 60 outputs the freeze reset signal /FREEZRST in response to the delay time $\Delta T10$ of delay circuit DL10 when the row act signal /ROWACT remains in the active state by the effect of the noise or the like. As a result, even if the row act signal /ROWACT remains in the active state after the time it should be set to the inactive state, the row act signal /ROWACT can be set to the inactive state by the operation of freeze reset circuit 60. Therefore, the noise immunity of semiconductor memory device 1 is enhanced, and the stability of the write or read operation can be ensured.

Figure 10:
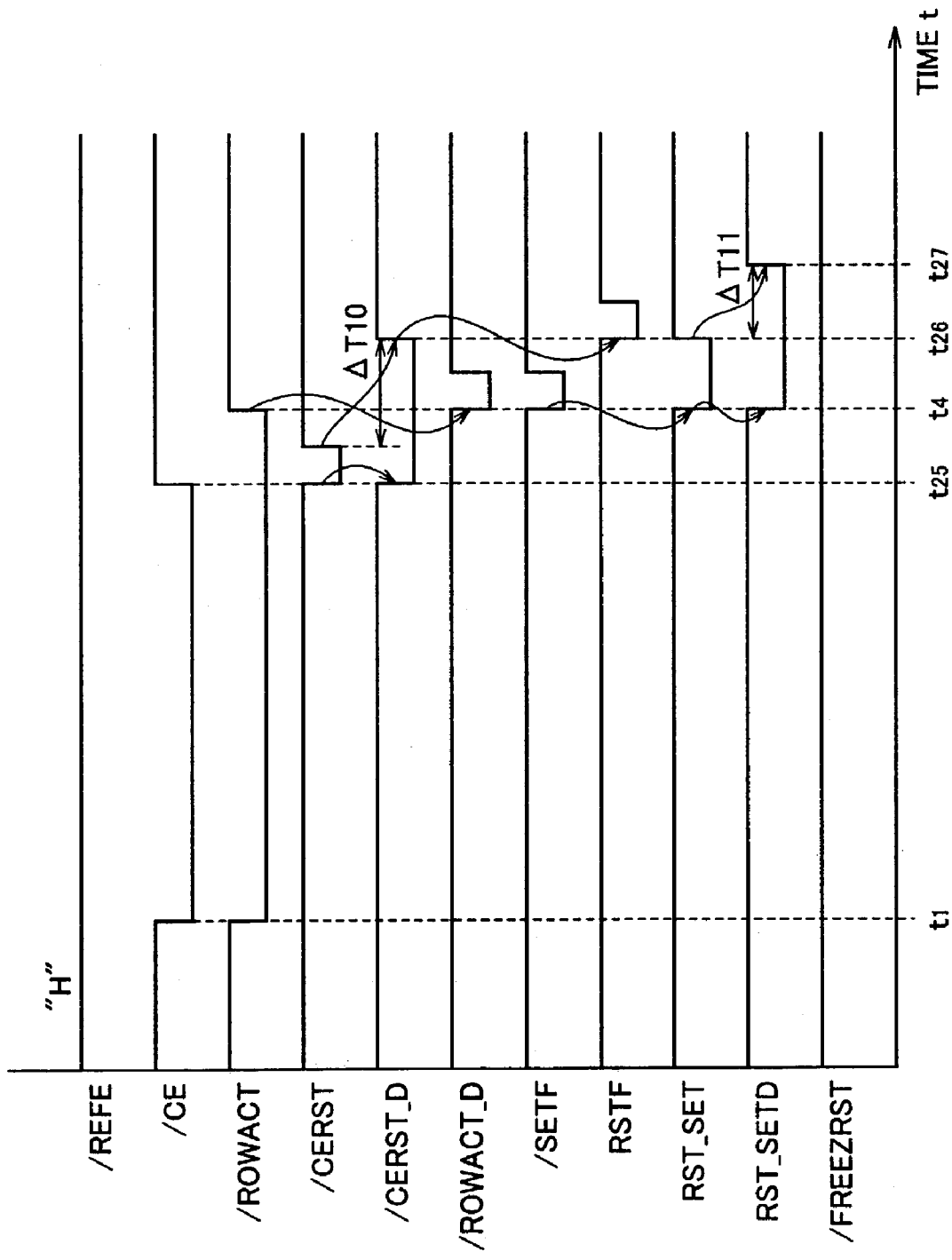
FIG. 10 is a timing chart showing an operation of the freeze reset circuit when the semiconductor memory device is not set to a freeze state.

FIG. 10 is a timing chart showing the operation of freeze reset circuit 60 when semiconductor memory device 1 is not set to a freeze state.

Referring to FIG. 10, the chip enable signal /CE is set to the L level at the time t1, and semiconductor memory device 1 is set to the operation state. In addition, the chip enable signal /CE is set to the H level at a time t25 before the time t5 in FIG. 8, and semiconductor memory device 1 is set to the standby state. At this point, one-shot pulse generation circuit OS4 outputs the one-shot pulse signal /CERST of the L level. In addition, trailing edge delay circuit DL10 sets the signal /CERSTD to the H level at a time t26, the predetermined time $\Delta T10$ after the one-shot pulse signal /CERST is set to the H level.

Assuming that the row act signal /ROWACT is set to the H level at the time t4 before the time t26, one-shot pulse generation circuit OS5 receives the row act signal /ROWACT of the H level and outputs the one-shot pulse signal /ROWACTD of the L level. As a result, logic gate L13 outputs the signal /SETF of the L level at the time t4. Thus, flip-flop FF4 is set, and outputs the signal RSTSET of the L level at the time t4.

On the other hand, one-shot pulse generation circuit OS6 outputs the one-shot pulse signal RSTF of the L level responsive to the one-shot pulse signal /CERSTD set from the L level to the H level at the time t26.

When the one-shot pulse signal RSTF is input to flip-flop FF4, flip-flop FF4 is reset. Therefore, the signal RSTSET is set to the H level at the time t26. The signal RSTSETD is set to the H level at a time t27, the predetermined period $\Delta T11$ after the signal RSTSET set to the H level.

As a result, logic gate L14 continuously outputs the freeze reset signal /FREEZRST of the H level even when the one-shot pulse signal RSTF is output from one-shot pulse generation circuit OS6. Thus, the freeze reset signal /FREEZRST is not activated when there is no effect of the noise or the like and each signal is normal.

As described above, freeze reset circuit 60 activates the freeze reset signal /FREEZRST when the predetermined period has passed after the chip enable signal /CE is set from the L level to the H level, thereby preventing semiconductor memory device 1 from continuing the write or read operation. Therefore, semiconductor memory device 1 can ensure the stability of the write or read operation.

If the predetermined time between the chip enable signal /CE being set to the H level and the freeze reset signal /FREEZRST being set to the L level is short, however, forced termination of the write or read operation may occur during the write or read operation of semiconductor memory device 1.

Figure 11:
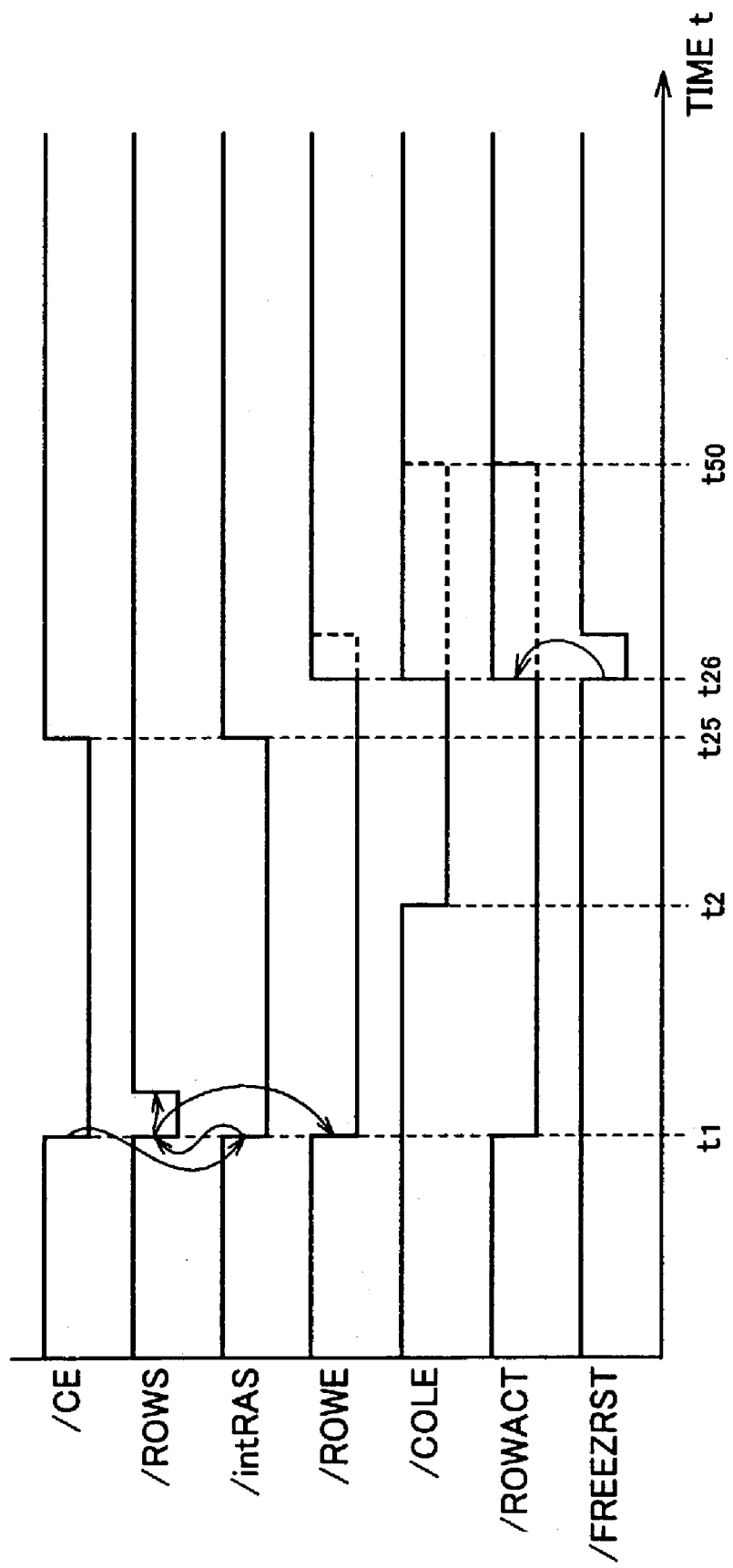
FIG. 11 is a timing chart showing an operation when the write or read operation is terminated by a freeze reset signal /FREEZRST during the write or read operation of the semiconductor memory device.

FIG. 11 is a timing chart showing the operation when the write or read operation is terminated by the freeze reset signal /FREEZRST during the write or read operation of semiconductor memory device 1.

Referring to FIG. 11, as the operation till the time t2 is the same as that shown in FIG. 4, description thereof will not be repeated.

Herein, it is assumed that the chip enable signal /CE is set to the H level at the time t25, and the active period of the chip enable signal /CE is shorter than a normal situation. It is to be noted that, the internal row address strobe signal int/RAS is also set to the H level at the time t25.

When the chip enable signal /CE is set to the H level at the time t25, one-shot pulse generation circuit OS4 in freeze reset circuit 60 outputs the one-shot pulse signal /CERST of the L level. Since the predetermined time ΔT10 determined in trailing edge delay circuit DL10 is short, when the one-shot pulse signal RSTF of the L level is output from one-shot pulse generation circuit OS6 at the time 26, the freeze reset signal /FREEZRST is output as the one-shot pulse signal from logic gate L14 at the time 26. As a result, flip-flops FF1, FF2 and FF3 are all reset. Thus, the row enable signal /ROWE, the column enable signal /COLE, and the row act signal /ROWACT are all set to the H level at the time t26.

With the above-mentioned operation, though the period needed for the read or write operation, that is, the period wherein the row act signal /ROWACT is in the active state is normally from the time t1 to a time t50, the write or read operation is forced to terminate at the time t26 during the write or read operation because the freeze reset signal /FREEZRST is activated.

Therefore, it is necessary to set the trailing edge delay time ΔT10 of trailing edge delay circuit DL10 in freeze reset circuit 60 such that, the write or read operation will not be forced to terminate during the write or read operation.

Figure 12:
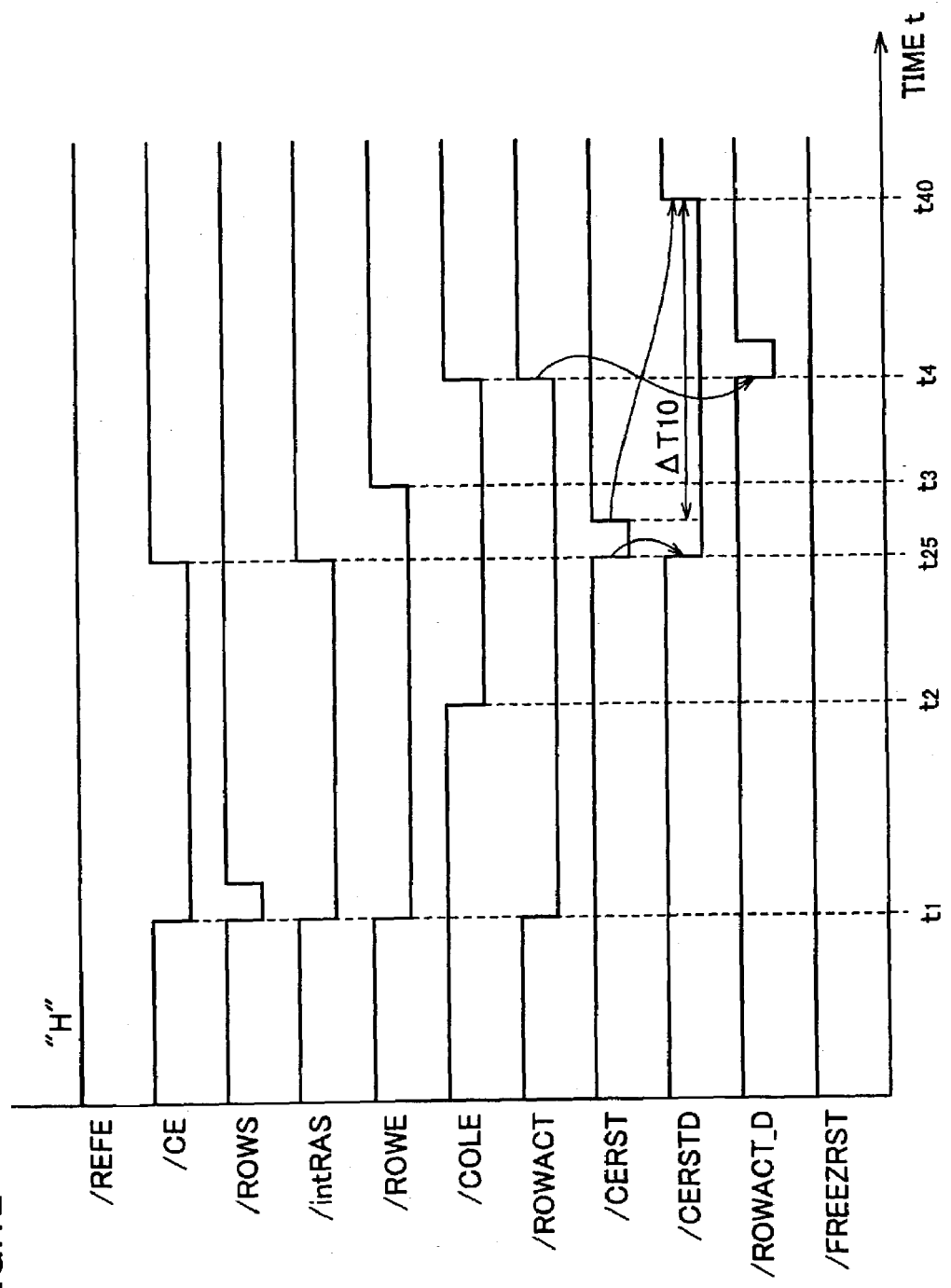
FIG. 12 is a timing chart showing the write or read operation of the semiconductor memory device when a trailing edge delay time of a trailing edge delay cycle in the freeze reset circuit is adjusted to an appropriate time.

FIG. 12 is a timing chart showing the write or read operation of semiconductor memory device 1 when the trailing edge delay time ΔT10 of trailing edge delay circuit DL10 in freeze reset circuit 60 is adjusted to an appropriate time.

Referring to FIG. 12, as the operation till the time t25 is the same as that shown in FIG. 11, description thereof will not be repeated.

As the chip enable signal /CE is set to the H level at the time t25, one-shot pulse generation circuit OS4 in freeze reset circuit 60 outputs the one-shot pulse signal /CERST of the L level. Thus, the signal /CERSTD output from trailing edge delay circuit DL10 is set to the L level at the time t25. In addition, the signal /CERSTD is set to the H level at a time t40, the trailing edge delay time ΔT10 after the one-shot pulse signal /CERST is set to the H level. This time, the trailing edge delay time ΔT10 is set such that the active period of the signal /CERSTD will become equal to or longer than the time needed for the write or read operation of semiconductor memory device 1. As a result, the row enable signal /ROWE is set to the H level at the time t3 before the time t40, and the column enable signal /COLE is set to the H level at the time t4. Thus, the row act signal /ROWACT is set to the H level at the time t4, and semiconductor memory device 1 terminates the write or read operation before the time t40.

As a result, the freeze reset signal /FREEZRST will not be activated during the write or read operation if the trailing edge delay time ΔT10 is set such that, the active period of the signal /CERSTD will become equal to or longer than the time needed for the write or read operation of semiconductor memory device 1. Consequently, the write or read operation of semiconductor memory device 1 becomes stable.

The operation of the semiconductor memory device when effected by the noise during the write or read operation, while the trailing edge delay time ΔT10 is set such that the active period of the signal /CERSTD will become equal to or longer than the time needed for the write or read operation of semiconductor memory device 1, will be described.

Figure 13:
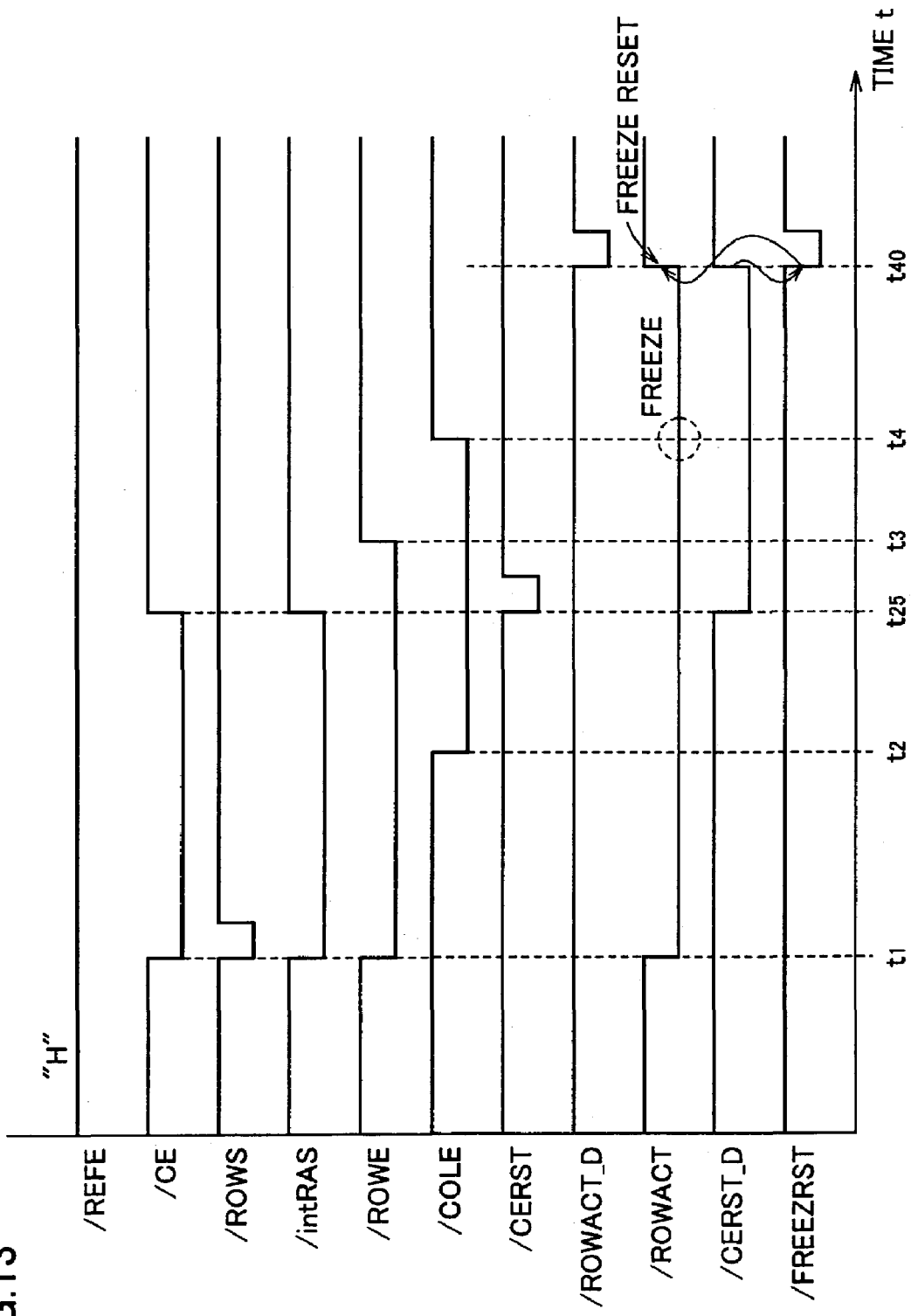
FIG. 13 is a timing chart showing an operation of the semiconductor memory device when effected by a noise during the write or read operation.

FIG. 13 is a timing chart showing the operation of the semiconductor memory device when effected by the noise during the write or read operation.

Referring to FIG. 13, as the operation till the time t3 is the same as that shown in FIG. 12, description thereof will not be repeated.

The row enable signal /ROWE is set to the H level at the time t3. In addition, the column enable signal /COLE is set to the H level at the time t4. Though the row act signal /ROWACT should normally be set to the H level at the time t4, in FIG. 13, the row act signal /ROWACT is not set to the H level at the time t4 because of the effect of the noise.

As a result, semiconductor memory device 1 continues the write or read operation after the time t4.

Similar to FIG. 12, however, because the one-shot pulse signal /CERST is activated at the time t25, the signal /CERSTD is set to the L level at the time t25. In addition, similar to FIG. 12, the signal /CERST is set to the H level at the time t40, after the trailing edge delay time ΔT10 has passed. As a result, logic gate L4 outputs the freeze reset signal /FREEZRST of the L level at the time t40.

As the freeze reset signal /FREEZRST is activated, flip-flops FF1, FF2 and FF3 in state control circuit 50 are all reset. As a result, the row act signal /ROWACT is set to the H level at the time t40.

In FIG. 13, the trailing edge delay time ΔT10 is set such that the period between the time t25 and the time t40, wherein the signal /CERSTD is activated, will become equal to or longer than the time needed for the write or read operation of semiconductor memory device 1. Thus, the freeze reset signal /FREEZRST will not be activated during the write or read operation of semiconductor memory device 1.

With the above-mentioned operation, semiconductor memory device 1 can ensure the stability of the write or read operation by setting the trailing edge delay time ΔT10 of trailing edge delay circuit DL10 in freeze reset circuit 60 to an appropriate time.

In the operation of the semiconductor memory device described above, the refresh command signal /REFE output from refresh circuit 40 remains at the H level whenever the semiconductor memory device is in the operation state. The refresh operation is performed, however, both in the standby state and the operation state. Therefore, depending on the operation of semiconductor memory device 1, there may be a situation wherein the chip enable signal /CE is set to the active state (the L level) and semiconductor memory device 1 is set to the operation state when the refresh command signal /REFE is at the active state (the L level).

Figure 14:
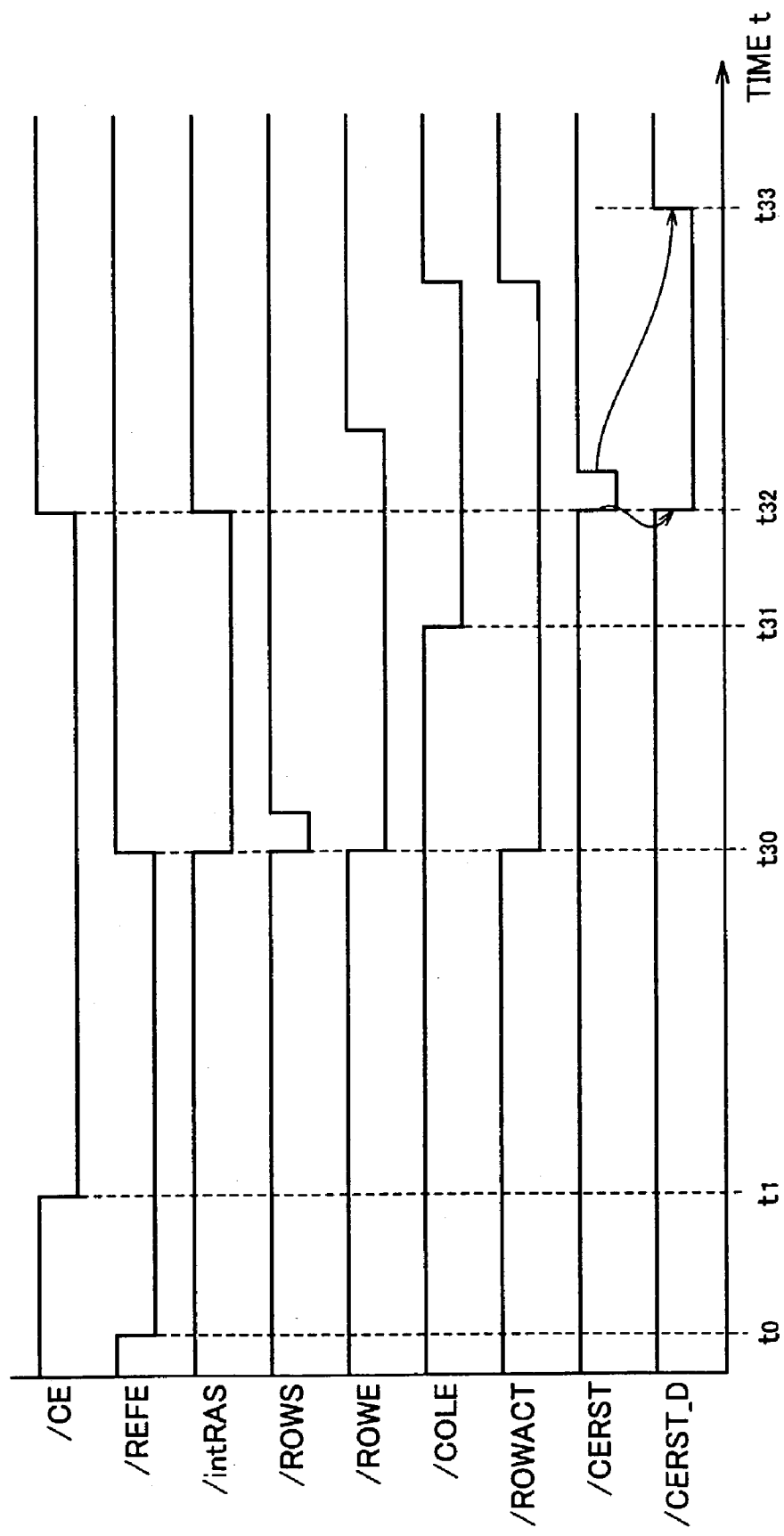
FIG. 14 is a timing chart showing the write or read operation of the semiconductor memory device if a refresh command signal remains at the L level when the semiconductor memory device changes from a standby state to an operation state.

FIG. 14 is a timing chart showing the write or read operation of semiconductor memory device 1 if the refresh command signal /REFE remains at the L level when semiconductor memory device 1 changes from the standby state to the operation state.

Referring to the FIG. 14, the refresh command signal /REFE is activated to the L level in the H level period of the chip enable signal /CE, that is, at a time t0 in the standby state. Thus, semiconductor memory device 1 performs the refresh operation after the time t0.

The chip enable signal /CE is set to the L level and semiconductor memory device 1 is set to the operation state at the time t1. The refresh command signal /REFE however remains at the L level after the time t1. As a result, the internal row address strobe signal int/RAS output from logic gate L1 in state control circuit 50 remains at the H level. With this operation, the refresh operation is continued through semiconductor memory device 1 is in the operation state after the time t1.

The refresh command signal /REFE is set to the H level and the refresh operation is terminated at a time t30. At this point, as the chip enable signal /CE remains at the L level, the internal row address strobe signal int/RAS output from logic gate L1 in state control circuit 50 is set to the L level. Thus, one-shot pulse generation circuit OS1 outputs the one-shot pulse signal /ROWS of the L level at the time t30. As a result, flip-flops FF1 and FF2 are set, and the row enable signal /ROWE and the row act signal /ROWACT are activated to the L level.

Thereafter, the column enable signal /COLE is set to the L level at a time t31, the predetermined time ΔT2 after the time t30 when the row enable signal /ROWE is set to the L level.

The chip enable signal /CE is then set to the H level at a time t32. As a result, one-shot pulse generation circuit OS4 in freeze reset circuit 60 outputs the one-shot pulse signal /CERST of the L level.

Delay circuit DL10 receives the one-shot pulse signal /CERST of the L level at the time t32, and outputs the signal /CERSTD of the L level. In addition, the signal /CERSTD is set to the H level at a time t33, the trailing edge delay time ΔT10 after the one-shot pulse signal /CERST set to the H level. It is to be noted that, in FIG. 14, the row enable signal /ROWE, the column enable signal /COLE and the row act signal /ROWACT are all set to the H level before the time t33 when the signal /CERSTD is set to the H level. Therefore, the freeze reset signal /FREEZRST (not shown) continuously remains at the H level.

As shown in FIG. 14, in semiconductor memory device 1, there may be a situation wherein the refresh command signal /REFE remains in the active state and the refresh is continued when it is set to the operation state. Thus, if the active period of the signal /CERSTD determined by delay circuit DL10 in freeze reset circuit 60 is set inappropriately, the freeze reset signal /FREEZRST will be activated during the write or read operation, as shown in FIG. 12.

Therefore, the active period of the signal /CERSTD output from delay circuit DL10 should be longer than the sum of the time needed for the refresh operation and the time needed for the write or read operation.

As a result, semiconductor memory device 1 can ensure the stability of the write or read operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an operation state capable of performing a read operation and a write operation of data and a standby state to hold said data, comprising:
    a memory cell array including a plurality of memory cells arranged in columns and rows; and
    a complete hidden refresh circuit refreshing said data held by said plurality of memory cells in a predetermined timing; wherein
    said complete hidden refresh circuit includes:
    a refresh circuit outputting a refresh command signal that commands to perform a refresh operation, and
    a control circuit outputting an internal operation designation signal that commands to perform a read or write operation of data in said operation state; and
    said control circuit includes:
    a first circuit activating and outputting said internal operation designation signal to start said operation state based on an external signal that commands to start said operation state, and terminating said operation state based on an external signal that commands to terminate said operation state, and
    a second circuit outputting a control signal via a signal path different from a signal path of said first circuit based on the external signal that commands to terminate said operation state to allow said first circuit to inactivate and output said internal operation designation signal.

2. The semiconductor memory device according to claim 1, wherein
    said second circuit includes a detection circuit detecting whether said write or read operation is terminated within said predetermined time after said operation state being set.

3. The semiconductor memory device according to claim 2, wherein said predetermined time is equal to or longer than a time needed for said write or read operation.

4. The semiconductor memory device according to claim 2, wherein said predetermined time is longer than the sum of a time needed for said refresh operation and a time needed for said write or read operation.

* * * * *